United States Patent
Koga et al.

(10) Patent No.: US 9,069,384 B2
(45) Date of Patent: Jun. 30, 2015

(54) ELECTRONIC DEVICE

(71) Applicant: Panasonic Corporation, Osaka (JP)

(72) Inventors: Akira Koga, Osaka (JP); Naoto Yumiki, Osaka (JP); Yusuke Adachi, Osaka (JP); Masahiro Inata, Hyogo (JP); Ryo Okumura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 55 days.

(21) Appl. No.: 13/950,438

(22) Filed: Jul. 25, 2013

(65) Prior Publication Data

US 2013/0307803 A1 Nov. 21, 2013

Related U.S. Application Data

(63) Continuation of application No. PCT/JP2012/000739, filed on Feb. 3, 2012.

(30) Foreign Application Priority Data

Feb. 4, 2011 (JP) ................................. 2011-022380

(51) Int. Cl.
*G06F 3/01* (2006.01)
*G06F 3/041* (2006.01)

(52) U.S. Cl.
CPC ................ *G06F 3/016* (2013.01); *G06F 3/041* (2013.01)

(58) Field of Classification Search
CPC ....... G06F 3/016; G06F 3/041; G06F 3/0416; G06F 3/033; G06F 3/044; G06F 3/046; G06F 2203/04106
USPC .......... 345/173, 174; 178/18.03, 18.06, 18.07
See application file for complete search history.

(56) References Cited

U.S. PATENT DOCUMENTS

| | | | |
|---|---|---|---|
| 5,777,605 A | 7/1998 | Yoshinobu et al. | |
| 2002/0149561 A1 | 10/2002 | Fukumoto et al. | |
| 2006/0152497 A1 | 7/2006 | Rekimoto | |
| 2008/0284753 A1* | 11/2008 | Hsu et al. ...................... | 345/174 |
| 2009/0262091 A1 | 10/2009 | Ikeda et al. | |

(Continued)

FOREIGN PATENT DOCUMENTS

| | | |
|---|---|---|
| JP | 04-199416 A | 7/1992 |
| JP | 06-083522 A | 3/1994 |

(Continued)

OTHER PUBLICATIONS

International Search Report for corresponding International Application No. PCT/JP2012/000739 mailed May 15, 2012.

*Primary Examiner* — Alexander Eisen
*Assistant Examiner* — Abhishek Sarma
(74) *Attorney, Agent, or Firm* — Renner, Otto, Boisselle & Sklar, LLP

(57) ABSTRACT

An electronic device 10 according to an embodiment includes: a display section 12 for displaying an operation area 40; a touch panel 11 disposed on a display surface side of the display section 12; a vibration section 13 for vibrating the touch panel 11; a vibration control section 33 for controlling a vibration pattern of the vibration section 13; and a detection section 20 for detecting whether an operation to the touch panel 11 has been made with a has been made with a finger of a user or a pen. The vibration control section 33 varies the vibration pattern of the vibration section 13 depending on whether a finger or a pen is detected by the detection section 20.

6 Claims, 14 Drawing Sheets

(56) References Cited

U.S. PATENT DOCUMENTS

2010/0164894 A1    7/2010  Kim et al.
2010/0328053 A1*  12/2010  Yeh et al. .................... 340/407.2
2011/0001708 A1*   1/2011  Sleeman ....................... 345/173
2011/0115741 A1*   5/2011  Lukas et al. .................. 345/174
2011/0298748 A1*  12/2011  Chen et al. ................... 345/174

FOREIGN PATENT DOCUMENTS

| JP | 08-307654 A   | 11/1996 |
| JP | 08-307954 A   | 11/1996 |
| JP | 2008-152640 A | 7/2008  |
| JP | 2010-221101 A | 10/2010 |

* cited by examiner

ELECTRONIC DEVICE

This is a continuation of International Application No. PCT/JP2012/000739, with an international filing date of Feb. 3, 2012, which claims priority of Japanese Patent Application No. 2011-022380, filed on Feb. 4, 2011, the contents of which are hereby incorporated by reference.

BACKGROUND

1. Technical Field

The present disclosure relates to an electronic device which generates vibration or the like in response to a touch operation by a user.

2. Description of the Related Art

In electronic devices having a touch panel disposed on a display screen, techniques of enhancing the user operability are known which involve vibrating the touch panel to provide a tactile sensation for the user. When a user operates a touch panel, the user may use a finger or a touch pen for the operation (see, for example, Japanese Laid-Open Patent Publication No. 4-199416).

SUMMARY

The present disclosure provides an electronic device which is capable of being operated by a user without feeling oddness even when the user operates the touch panel with plural types of input means, e.g., a finger and a touch pen.

An electronic device according to an embodiment comprising: a panel touched by a user; a vibration section for vibrating the panel; a vibration control section for controlling the vibration section; and a detection section for detecting whether an operation to the panel has been made with a finger of a user or a pen, wherein the vibration control section controls the vibration section depending on whether a finger or a pen is detected by the detection section.

A program according to an embodiment is a program for causing an electronic device to perform an operation of vibrating a panel, the program causing the electronic device to execute: a step of detecting whether an operation to the panel has been made with a finger of a user or a pen; and a step of controlling vibration of the panel depending on whether a finger or a pen is detected.

According to an embodiment, depending on whether a finger of a user or a pen is detected, a vibration pattern of the touch panel is varied. As a result, the user is able to perform operation without oddness even when operating the touch panel by using plural types of input means, e.g., a finger and a pen.

In one embodiment, a greater vibration is caused in the touch panel when a finger is detected than when a pen is detected. Since the tip of a pen is generally harder than a finger, the same vibration will be conveyed more strongly to the user via a pen than via a finger. The user feeling different tactile sensations between when the touch panel is touched with a finger and when it is touched with a pen will lead to an operation oddness. By causing a greater vibration in the touch panel when a finger is detected than when a pen is detected, the user is allowed to feel the same degree of vibration, thereby reducing the aforementioned oddness.

These general and specific aspects may be implemented using a system, a method, and a computer program, and any combination of systems, methods, and computer programs.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

Figure 1:
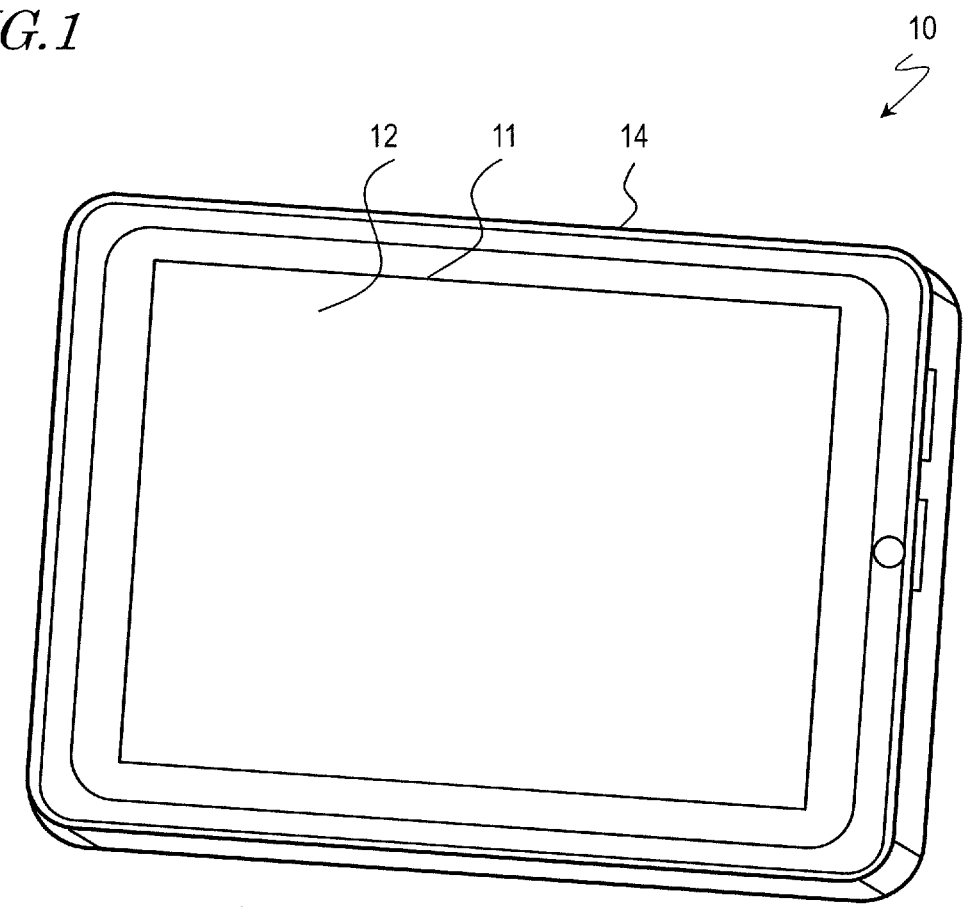
FIG. 1 is a perspective view showing the appearance of an electronic device according to an Embodiment.

An embodiment will now be described in detail, referring to the drawings. Note however that unnecessarily detailed descriptions may be omitted. For example, detailed descriptions on what are well known in the art or redundant descriptions on substantially the same configurations may be omitted. This is to prevent the following description from becoming unnecessarily redundant, to make it easier for a person of ordinary skill in the art to understand.

Note that the present inventors provide the accompanying drawings and the following description in order for a person of ordinary skill in the art to sufficiently understand the present disclosure, and they are not intended to limit the subject matter set forth in the claims.

In the construction described in Japanese Laid-Open Patent Publication No. 4-199416, the same vibration is presented regardless whether the touch panel is touched with a finger or touched with a touch pen. Since vibration propagates in different manners through a finger and a touch pen, the user may feel oddness in the operation.

The present disclosure provides an electronic device which is capable of being operated by a user without feeling oddness even when the user operates the touch panel with plural types of input means, e.g., a finger and a touch pen.

Embodiment 1

Overall Construction of Electronic Device

Figure 2:
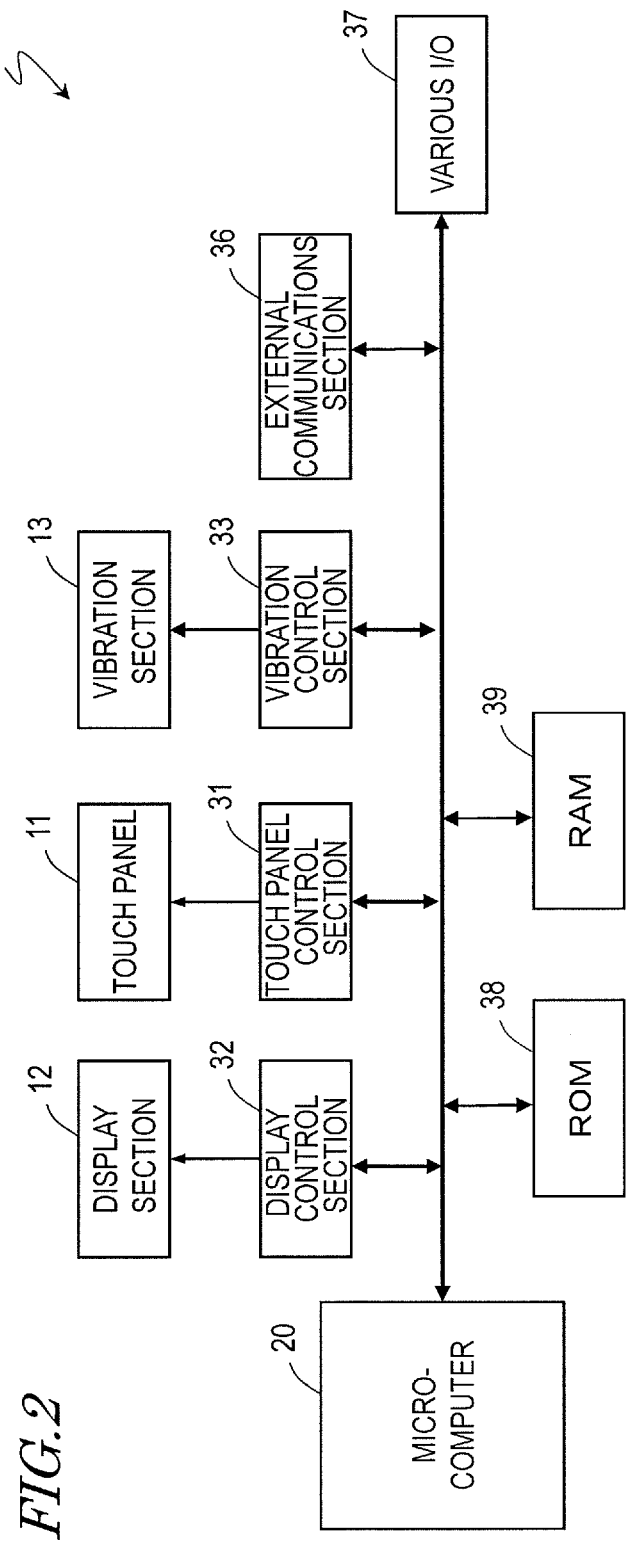
FIG. 2 is a block diagram showing an electronic device according to an Embodiment.
Figure 3:
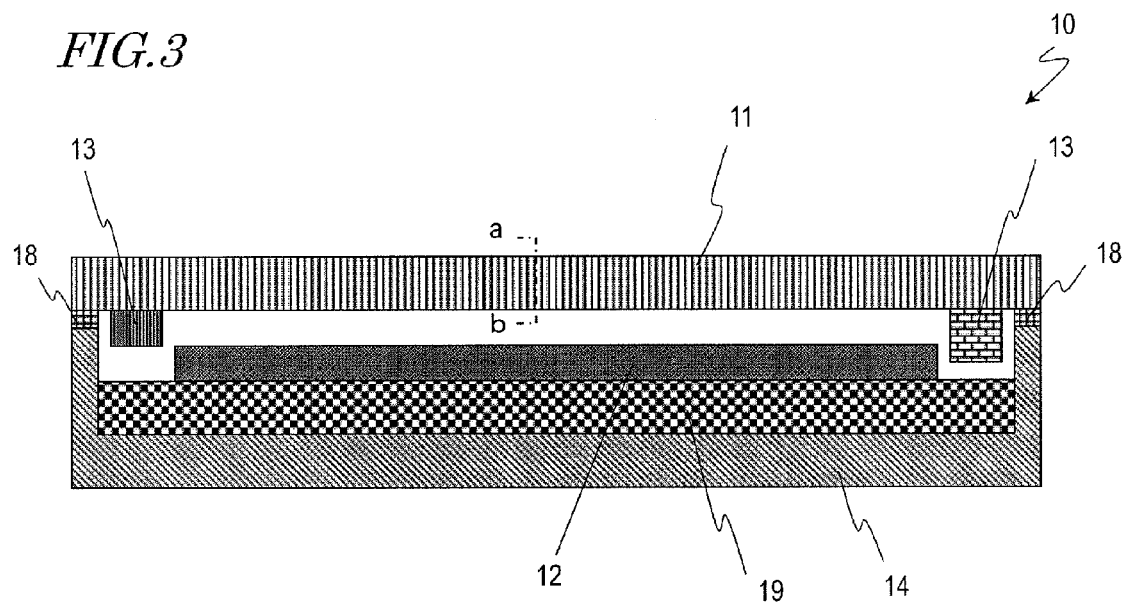
FIG. 3 is a cross-sectional view of an electronic device according town Embodiment.

With reference to FIGS. 1, 2, and 3, the overall construction of an electronic device 10 according to the present embodiment will be described.

FIG. 1 is a perspective view showing the appearance of the electronic device 10. FIG. 2 is a block diagram showing the construction of the electronic device 10.

As shown in FIGS. 1 and 2, the electronic device 10 mainly includes a touch panel 11, a display section 12, a vibration section 13, a vibration control section 33, and a microcomputer 20. The touch panel 11 is provided on a display surface side of the display section 12, and covers at least a portion of the display section 12. The vibration section 13 vibrates the touch panel 11. The vibration control section 33 controls the vibration of the vibration section 13. The microcomputer 20 detects whether an input means employed by the user to touch the touch panel 11 is a finger or a pen. As used herein, a pen is meant to be any type of pen that permits operation of the touch panel 11, and may be referred to as a touch pen or as a stylus. Note that any writing instrument designed for writing on paper that also permits operation of the touch panel 11 may be used as a pen in the meaning of the present disclosure.

The user operates the electronic device 10 by touching on what is displayed on the display section 12 with a finger, a pen, or the like. A circuit board 19 having various electronic parts mounted thereon, e.g., a microcomputer 20, is disposed in a housing 14.

<Individual Component Elements>

The display section 12 displays characters, numbers, figures, keyboards, and the like. The display section 12 includes an operation area 40 (FIG. 5) which is a region that is manipulable by the user. The operation area 40 displays an image of something which accepts an input made by the user, e.g., a keyboard. By performing a touch operation at an arbitrary position on the keyboard which is displayed in the display section 12, the user is able to make a text input, etc. As the display section 12, any known display device may be used, e.g., liquid crystal, organic EL, electronic paper, or plasma.

The display control section 32 controls the content displayed by the display section 12 based on a control signal which is generated by the microcomputer 20.

The touch panel 11 is disposed on the display section 12 so as to at least cover the operation area 40. The user is able to manipulate the electronic device 10 through a touch operation on the touch panel 11 with a finger, a pen, or the like. The touch panel 11 is able to sense a touched position of the user. The information of the user's touched position is sent to the microcomputer 20, via a touch panel control section 31. By using the information of the user's touched position, the microcomputer 20 performs various processes described later.

The touch panel 11 may be a touch panel of, for example, an electrostatic type, a resistive membrane type, an optical type, an ultrasonic type, an electromagnetic type, etc.

The vibration section 13 vibrates the touch panel 11. The vibration control section 33 controls the vibration pattern of the vibration section 13. The construction of the vibration section 13 and the detailed vibration patterns will be described later.

Moreover, the electronic device 10 includes an input/output section 37 of any of various types which is capable of handling input/output from or to various electronic devices. An external communications section 36 is a communications means which enables communications over the Internet, communications with a personal computer, and so on, for example.

<Relative Positions of Component Elements>

FIG. 3 is a cross-sectional view of the electronic device 10. The electronic device 10 of the present embodiment is constructed so that the touch panel 11, the display section 12, the vibration section 13, and the circuit board 19 are disposed in the housing 14. The microcomputer 20, a ROM 38, a RAM 39, various control sections, a power supply, and the like are disposed on the circuit board 19.

The vibration section 13, which is mounted on the touch panel 11, vibrates the touch panel 11 so as to allow the user to experience tactile sensations. The touch panel 11 is disposed on the housing 14 via spacers 18, the spacers 18 facilitating transmission of the vibration of the touch panel 11 to the housing 14. The spacers 18 may be cushioning members of silicone rubber, urethane rubber, or the like, for example.

The display section 12 is placed within the housing 14, and the touch panel 11 covers the display section 12. The touch panel 11, the vibration section 13, and the display section 12 are electrically connected to a circuit board.

<Construction of Vibration Section>

Figure 4:
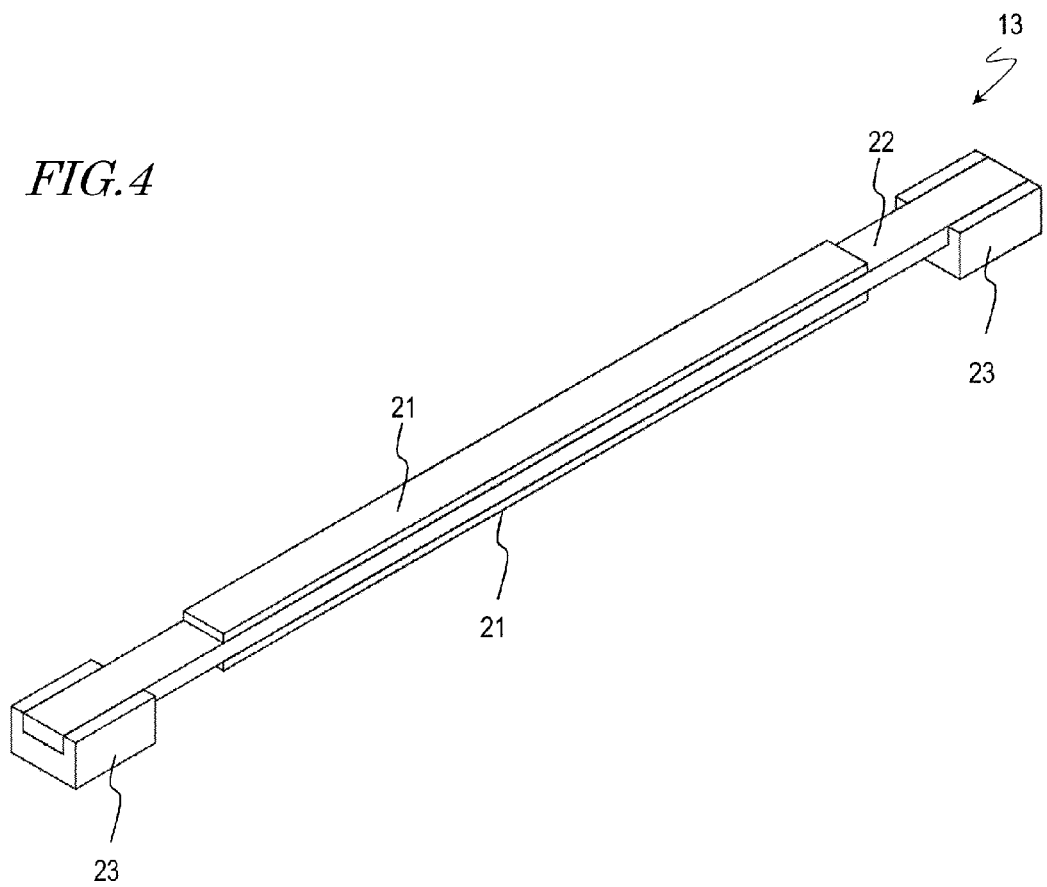
FIG. 4 is a perspective view showing the appearance of a vibration section according to an Embodiment.

With reference to FIG. 4, the construction of the vibration section 13 is described. FIG. 4 is a perspective view of the vibration section 13 according to the present embodiment. The vibration section 13 includes piezoelectric elements 21, a shim 22, and bases 23. On both sides of the shim 22, the piezoelectric elements 21 are adhesively bonded. Both ends of the shim 22 are connected to the bases 23, thus realizing a so-called simple beam construction. The bases 23 are connected to the touch panel 11.

The piezoelectric elements 21 are pieces piezoelectric ceramic such as lead zirconate titanate or a piezoelectric single crystal such as lithium niobate. With a voltage being applied from the vibration control section 33, the piezoelectric elements 21 expand or contract. By controlling them so that one of the piezoelectric elements 21, attached on both sides of the shim 22, expands while the other shrinks, flexural vibrations are caused in the shim 22.

The shim 22 is a spring member of e.g. phosphor bronze. The bases 23 are made of a metal such as aluminum or brass, or a plastic such as PET or PP. By way of the bases 23, the vibration of the shim 22 causes the touch panel 11 to also vibrate, whereby the user operating on the touch panel is able to detect the vibration of the touch panel. The frequency, amplitude, and period of the vibration are controlled by the vibration control section 33. For example, as the frequency of vibration, a frequency is about 100 to 400 Hz.

Although the present embodiment illustrates that the piezoelectric elements 21 are attached on the shim 22, the piezoelectric elements 21 may be attached directly onto the touch panel 11. Moreover, a thin-film piezoelectric member may be formed on the touch panel 11 by a method such as sputtering, so as to be used as the vibration section 13. In the case where a cover member or the like exists on the touch panel 11, the piezoelectric elements 21 may be attached on that cover member. Instead of piezoelectric elements 21, a vibration motor may be used.

<Text Input Operation>

With reference to FIGS. 5, 6, 7, and 8, an input operation to the touch panel 11 will be described.

Figure 5:
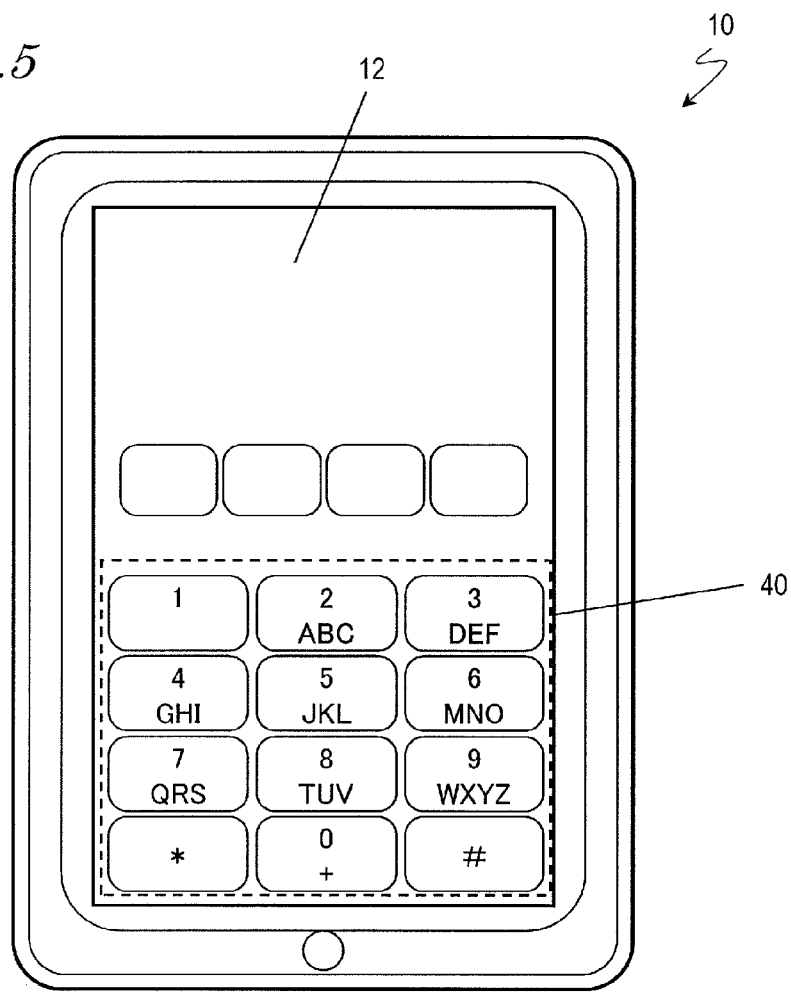
FIG. 5 is a diagram showing a screen display section of an electronic device according to an Embodiment.

FIG. 5 is an exemplary displayed image on the electronic device 10, representing a numeric keypad. By touching on the numeric keypad displayed in the display section 12 of the electronic device 10, the user enters a number.

Figure 6:
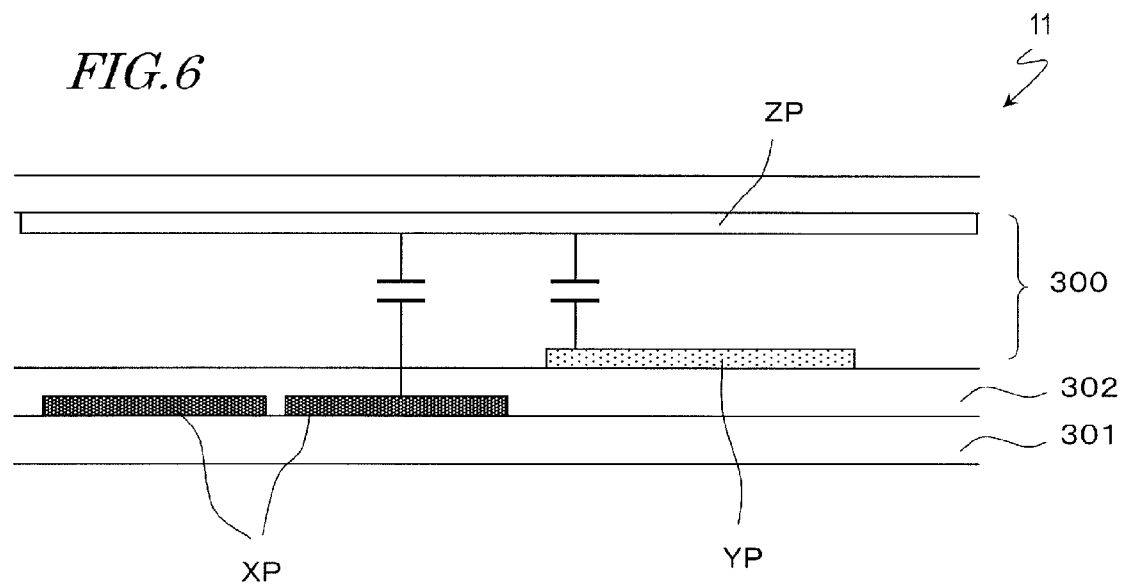
FIG. 6 is a cross-sectional view of a touch panel according to an Embodiment.

FIG. 6 is a cross-sectional view of the touch panel 11 corresponding to line a-b in FIG. 3. Each X electrode XP extends in a first direction (a direction which is perpendicular to the plane of the figure), and in juxtaposition thereto, each Y electrode YP extends in a second direction which intersects the first direction of the X electrodes XP. The Y electrodes YP are stacked on a transparent substrate 301 via an interlayer insulating film 302. A Z electrode ZP, which has a planar shape covering the X electrodes XP and the Y electrodes YP, is disposed opposite from the X electrodes XP and the Y electrodes YP. An insulating layer 300 for pressure detection is provided between the X electrodes XP and Y electrodes YP and the Z electrode ZP. In this example, the touch panel 11 is a pressure-sensing type touch panel which detects a pressure which is applied to the touch panel through an operation of the user.

The X electrodes XP, the Y electrodes YP, and the Z electrode ZP are made of a transparent electrically conductive material such as ITO (Indium Tin Oxide), for example. The insulating layer 300 for pressure detection may be made of a gel sheet, e.g., paraffin-type oil or silicone rubber-type material, for example.

Figure 7:
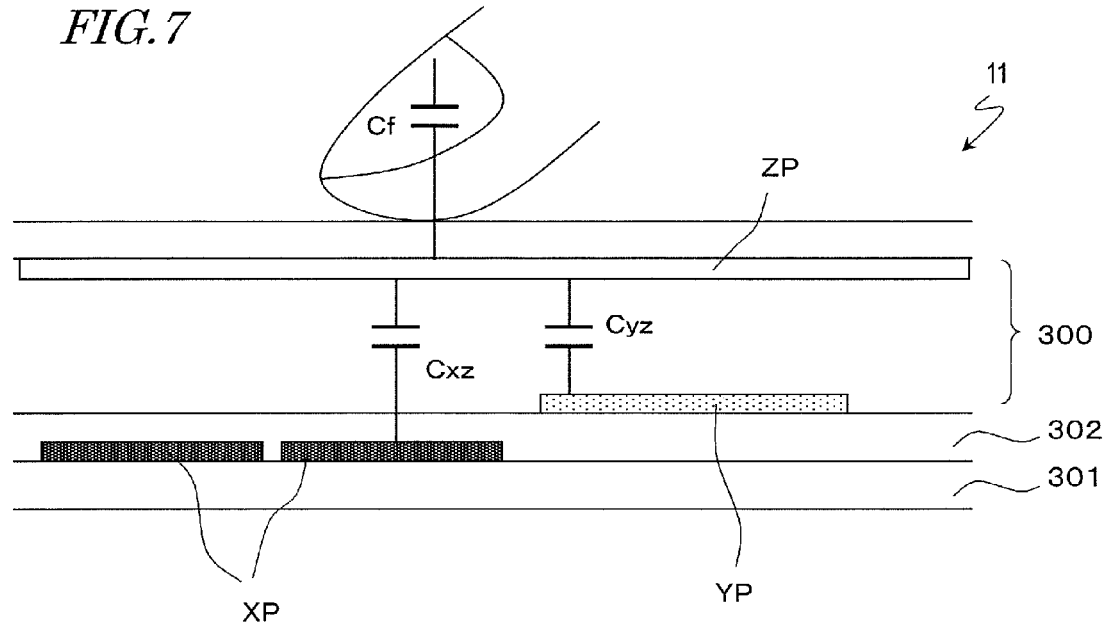
FIG. 7 is a cross-sectional view of a touch panel according to an Embodiment.

FIG. 7 is a cross-sectional view showing the touch panel 11 under a touch operation with a finger. It is assumed herein that the touch occurs with such a light pressing that the thickness of the insulating layer 300 for pressure detection is not affected. It is also assumed that, in the absence of a touch operation, a capacitance $Cxz$ exists between an X electrode XP and the Z electrode ZP and a capacitance $Cyz$ exists between a Y electrode YP and the electrode ZP.

When it is the capacitance $Cxz$ of the X electrode XP that is detected, the Y electrode YP, which is in a reset state, has the GND potential. Therefore, since the Z electrode ZP is in a floating state, the combined capacitance as viewed from the X electrode XP is a capacitance corresponding to a series connection of $Cxz$ and $Cyz$. This combined capacitance $Cxp$ at the X electrode XP is expressed by the following equation.

$$Cxp = Cxz \cdot Cyz/(Cxz+Cyz) \qquad \text{eq. (1)}$$

When there is contact of a finger through a touch operation, it is effectively a state where an electrostatic capacitance component $Cf$ of the finger is electrically connected to the Z electrode ZP. A combined capacitance $Cxpf$ at the X electrode XP during a touch operation is expressed by the following equation.

$$Cxpf = Cxz \cdot (Cyz+Cf)/(Cxz+Cyz+Cf) \qquad \text{eq. (2)}$$

The microcomputer 20 calculates a difference between the combined capacitance $Cxp$ at the X electrode XP in the absence of a touch operation and the combined capacitance $Cxpf$ at the X electrode XP during a touch operation, and regards this difference as a signal component of the X electrode XP. The difference $\Delta Cxp$ in electrode capacitance depending on presence or absence of a touch operation can be calculated from eq. (1) and eq. (2).

$$\Delta Cxp = Cxz^2 \cdot Cf / \{(Cxz+Cyz)(Cxz+Cyz+Cf)\} \qquad \text{eq. (3)}$$

As is seen from eq. (3), the difference $\Delta Cxp$ in electrode capacitance depends on the electrostatic capacitance $Cf$ of the finger, and therefore the microcomputer 20 can calculate this difference as a signal component of the X electrode XP.

Figure 8:
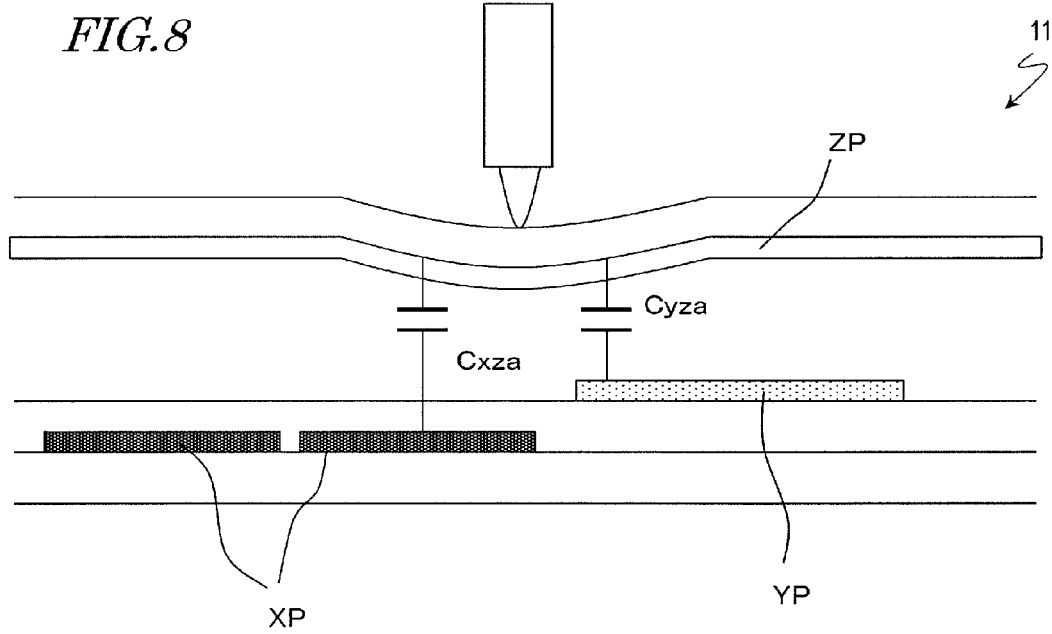
FIG. 8 is a cross-sectional view of a touch panel according to an Embodiment.

FIG. 8 is a cross-sectional view showing the touch panel 11 under a touch operation with a pen. As has been described with reference to FIG. 6, the capacitance of the X electrode XP in the absence of a touch operation is expressed by eq. (1). It is assumed that, when the insulating layer 300 for pressure detection has become thinner due to the pressing in a touch, a capacitance $Cxza$ exists between the X electrode XP and the Z electrode ZP and a capacitance $Cyza$ exists between the Y electrode YP and the Z electrode ZP. Then, the following inequalities hold because a parallel-plate capacitance is in inverse proportion to thickness.

$$Cxza > Cxz, \; Cyza > Cyz \qquad \text{eq. (4)}$$

When it is the electrode capacitance of the X electrode XP that is detected, the Y electrode YP, which is in a reset state, has the GND potential. Therefore, since the Z electrode ZP is in a floating state, the combined capacitance as viewed from the X electrode XP is a capacitance corresponding to a series connection of $Cxza$ and $Cyza$. This combined capacitance $Cxpa$ at the X electrode XP is expressed by the following equation.

$$Cxpa = Cxza \cdot Cyza/(Cxza+Cyza) \qquad \text{eq. (5)}$$

The microcomputer 20 calculates a difference between the capacitance $Cxp$ at the X electrode in the absence of a touch operation and the capacitance $Cxpa$ at the X electrode during a touch operation, and regards this difference as a signal component of the X electrode XP. The difference $\Delta Cxpa$ in electrode capacitance depending on presence or absence of a touch operation can be calculated from eq. (1) and eq. (5).

$$\Delta Cxpa = \{Cxz \cdot Cxza(Cyza-Cyz)+Cyz \cdot Cyza(Cxza-Cxz)\}/\{(Cxz+Cyz)(Cxza+Cyza)\} \qquad \text{eq. (6)}$$

As is seen from eq. (4) and eq. (6), the difference $\Delta Cxpa$ in electrode capacitance is detectable, and the microcomputer 20 can calculate this difference as a signal component of the X electrode XP.

Thus, even when a pen which is an electrically non-conductive input means is used, sensing is possible by detecting a change in capacitance which occurs due to a change in the thickness of the insulating layer 300 for pressure detection that is caused by pressing, owing to the use of the insulating layer 300 for pressure detection and the Z electrode ZP. Not only can the input coordinates be sensed, but also an input with a finger can be distinguished from an input with a pen, based on the change in capacitance.

Figure 9:
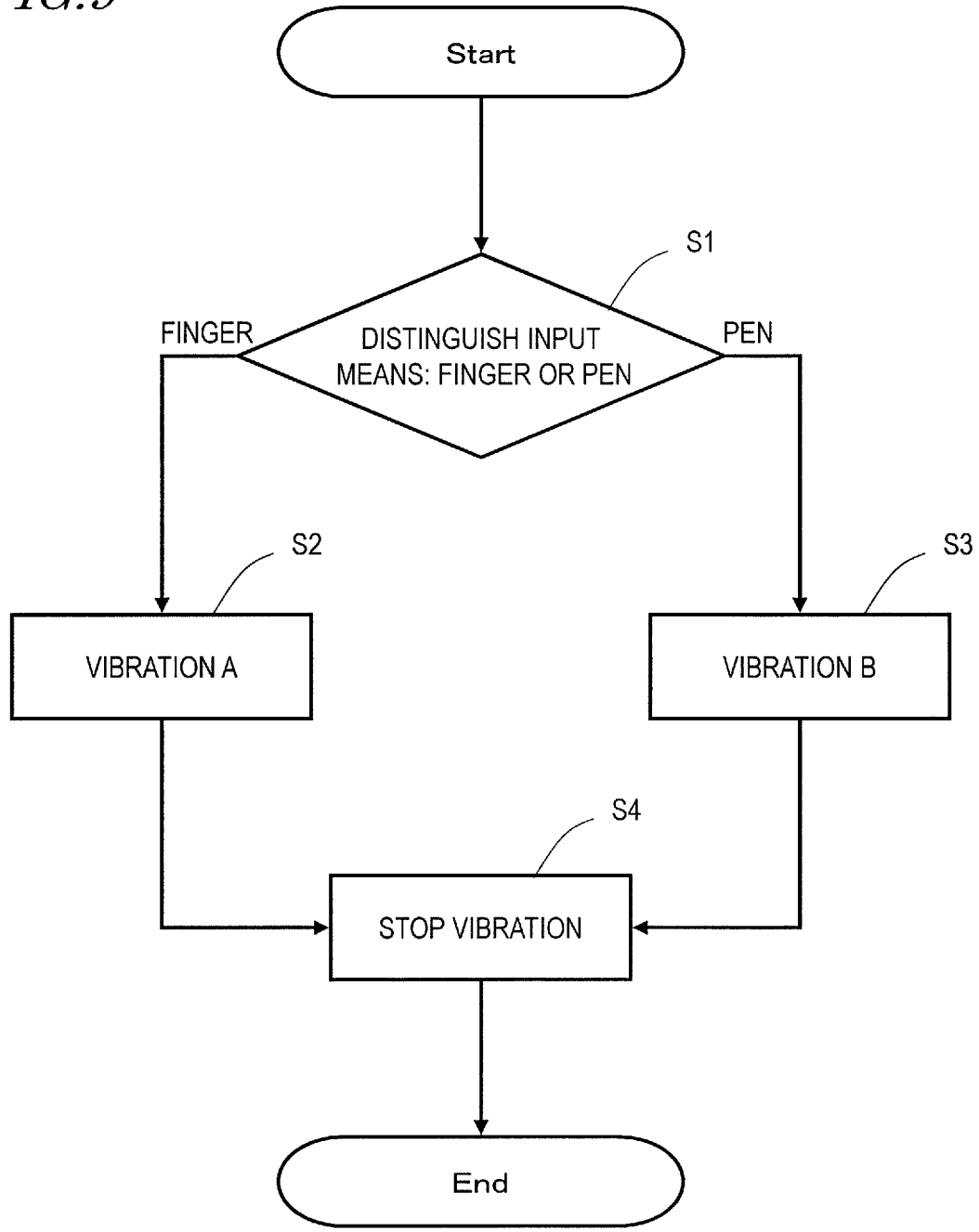
FIG. 9 is a flowchart showing an operation of an electronic device according to an Embodiment.

FIG. 9 is a flowchart showing a flow of touch operation according to the first embodiment, where "S" stands for "step". After the touch operation is started, at S1, base on information from the touch panel control section 31, the microcomputer 20 makes a distinction as to whether a finger touch has been made or a pen touch has been made. If the operation to the touch panel 11 has been made with a finger, the electrostatic capacitance value decreases; if the operation to the touch panel 11 has been made with a pen, the electrostatic capacitance value increases. If the detected electrostatic capacitance value is equal to or greater than a threshold value, the microcomputer 20 determines that the operation to the touch panel 11 has been made with a pen; if it is less than the threshold value, the microcomputer 20 determines that the operation to the touch panel 11 has been made with a finger. If it is distinguished by the microcomputer 20 that a finger touch has been made, the process proceeds to S2. At S2, the vibration control section 33 controls the operation of the vibration section 13 so as to vibrate the touch panel 11 with vibration A, and the user recognizes this vibration. If it is distinguished by the microcomputer 20 at S1 that a pen touch has been made, control proceeds to S3, where the vibration section 13 is controlled so as to vibrate the touch panel 11 with vibration B, and the user recognizes this vibration. After the respective vibration is applied at S2 or S3, control proceeds to S4, where the vibration control section 33 stops vibration of the vibration section 13.

Figure 10A:
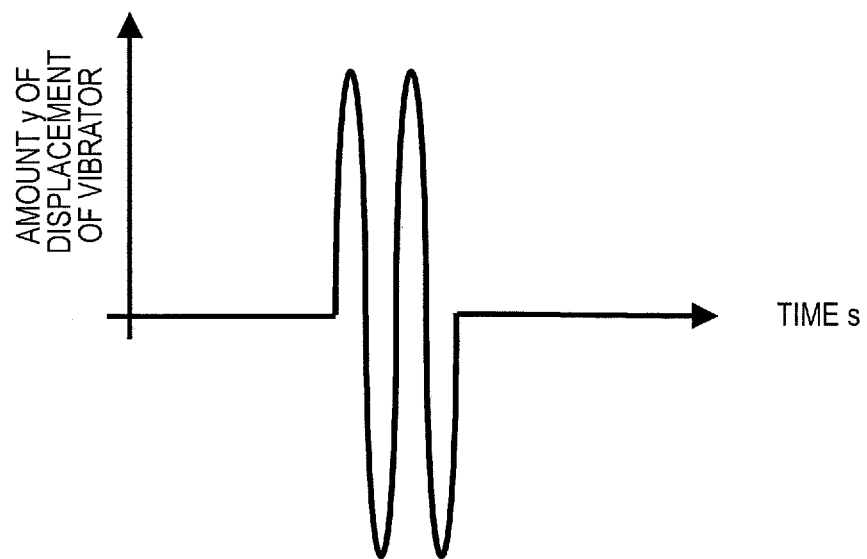
FIGS. 10A and 10B are diagrams showing vibration patterns according to an Embodiment.
Figure 10B:
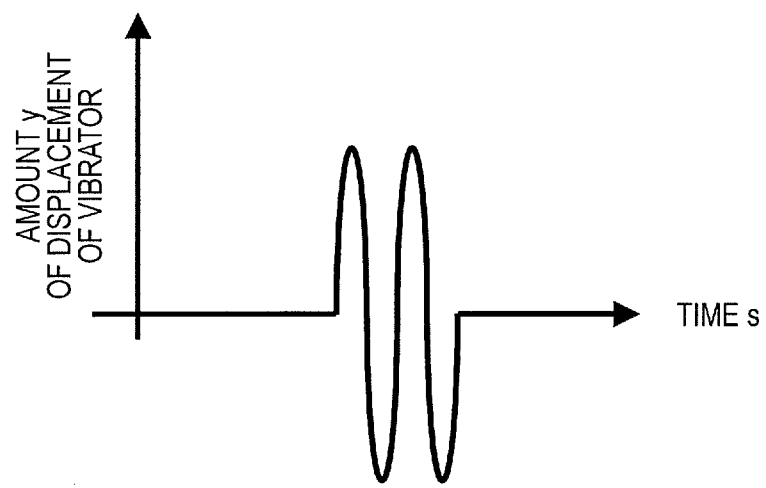

FIGS. 10A and 10B are diagrams showing exemplary vibration patterns.

Based on an instruction from the microcomputer 20, the vibration control section 33 applies a voltage of a waveform as shown in FIG. 10A to the vibration section 13 so as to vibrate the touch panel 11, thereby presenting vibration A to the user. The voltage for presenting vibration A is a sine wave of 150 Hz, 100 Vrms, 2 cycles. In this case, there is about a 5 μm amplitude on the touch panel 11. Alternatively, the vibration control section 33 applies a voltage as shown in FIG. 10B to the vibration section 13 so as to vibrate the touch panel 11, thereby presenting vibration B to the user. The voltage for presenting vibration B may be a sine wave of 150 Hz, 70 Vrms, 2 cycles. The frequency, voltage, and number of cycles are only exemplary; another waveform such as a rectangular wave or a sawtooth wave, an intermittent waveform, a waveform with a gradually changing frequency or amplitude, etc., may also be used. By ensuring that vibration A is stronger than vibration B, the user making a touch operation with a finger, which is less sensitive to vibration, is allowed to feel a vibration of about the same intensity as when making a pen touch.

Although the present embodiment illustrates that vibration A and vibration B are vibration patterns only differing in vibration amplitude, the embodiment is not limited thereto. Frequency may also be varied between vibration A and vibration B.

Embodiment 2

Next, an operation of an electronic device according to Embodiment 2 will be described. The electronic device of Embodiment 2 is basically similar in construction to the electronic device of Embodiment 1. The electronic device of Embodiment 2 differs from the electronic device of Embodiment 1 in that an approaching finger of a user is sensed based on a change in electrostatic capacitance. Specifically, the method of distinguishing the input means at S1 in the flowchart of FIG. 9 is different. Hereinafter, the difference will mainly be described.

Figure 11:
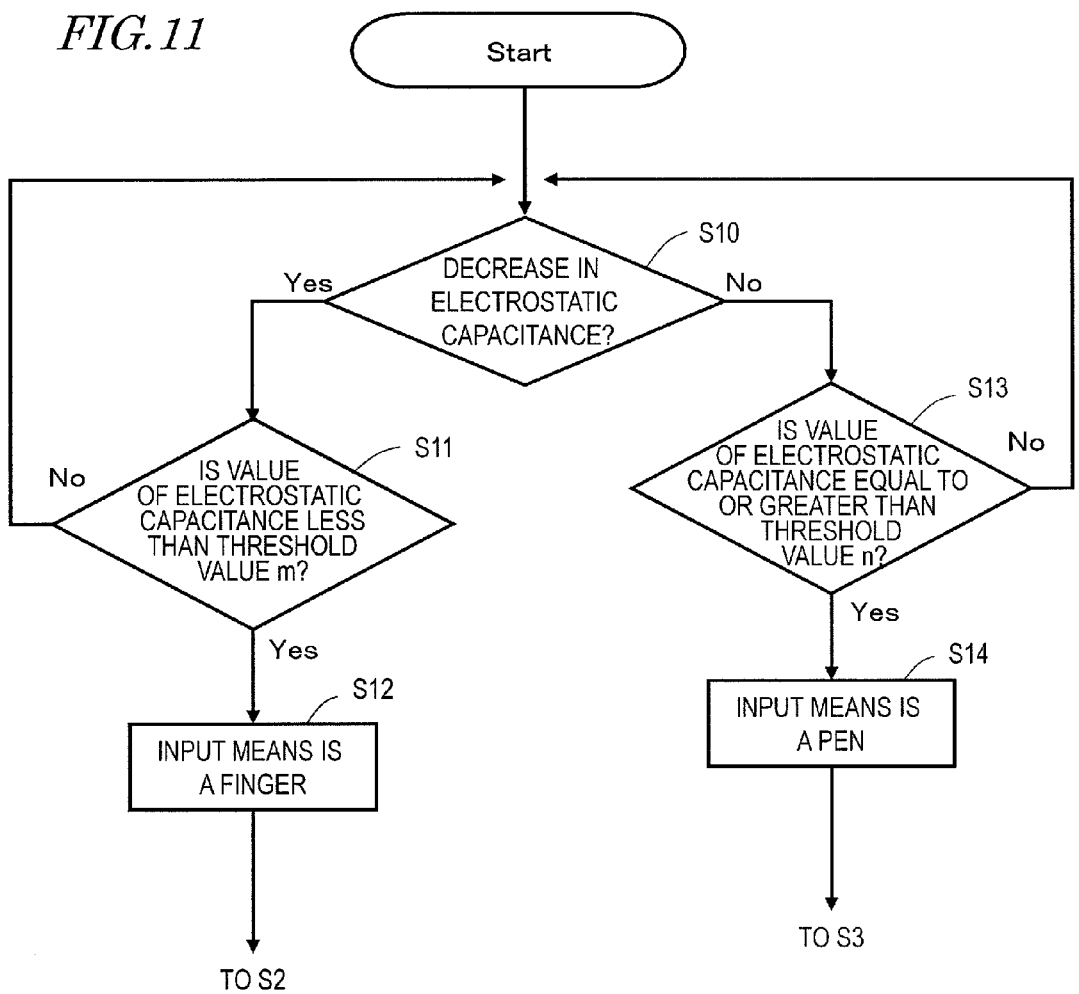
FIG. 11 is a flowchart showing an operation of an electronic device according to an Embodiment.

FIG. 11 is a flowchart showing the details of S1 in the flowchart of FIG. 9, that is, a process of distinguishing the input means. Herein, a distinction is made as to whether the input means is a finger or a pen.

When the electronic device 10 proceeds to S10 from a state of waiting for an input, the microcomputer 20 detects whether a decrease in electrostatic capacitance has occurred at an X electrode and a Y electrode. If S10 detects a decrease in electrostatic capacitance before a touch has been made to the touch panel 11, it means that a finger is approaching the touch panel 11, and control proceeds to S11. If it is found at S11 that the electrostatic capacitance has become less than a threshold value m, it is determined that a touch has been made, and control proceeds to S12 for making the distinction that the input means is a finger. Then, the process proceeds to S2 in the flowchart shown in FIG. 9. If S11 finds that the electrostatic capacitance is not less than the threshold value m, it is determined that no touch has been made, and control returns to S10.

On the other hand, if no decrease in electrostatic capacitance is detected at S10, control proceeds to S13. If the electrostatic capacitances of the X electrode and the Y electrode increases to a threshold value n or more at S13, it is determined that a touch has been made, and control proceeds to S14 for making the distinction that the input means is a pen. Then, the process proceeds to S3 in the flowchart shown in FIG. 9. If S13 finds that the electrostatic capacitance is not equal to or greater than the threshold value n, it is determine that no touch has been made, and control returns to S10.

Embodiment 3

Next, an operation of an electronic device according to Embodiment 3 will be described. The electronic device of Embodiment 3 is basically similar in construction to the electronic devices of Embodiments 1 and 2. The electronic device of Embodiment 3 differs from the electronic devices of Embodiments 1 and 2 in that it distinguishes the input means by using a threshold value for the flexure of the Z electrode. Specifically, the method of distinguishing the input means at S1 in the flowchart of FIG. 9 is different. Hereinafter, the difference will mainly be described.

Figure 12:
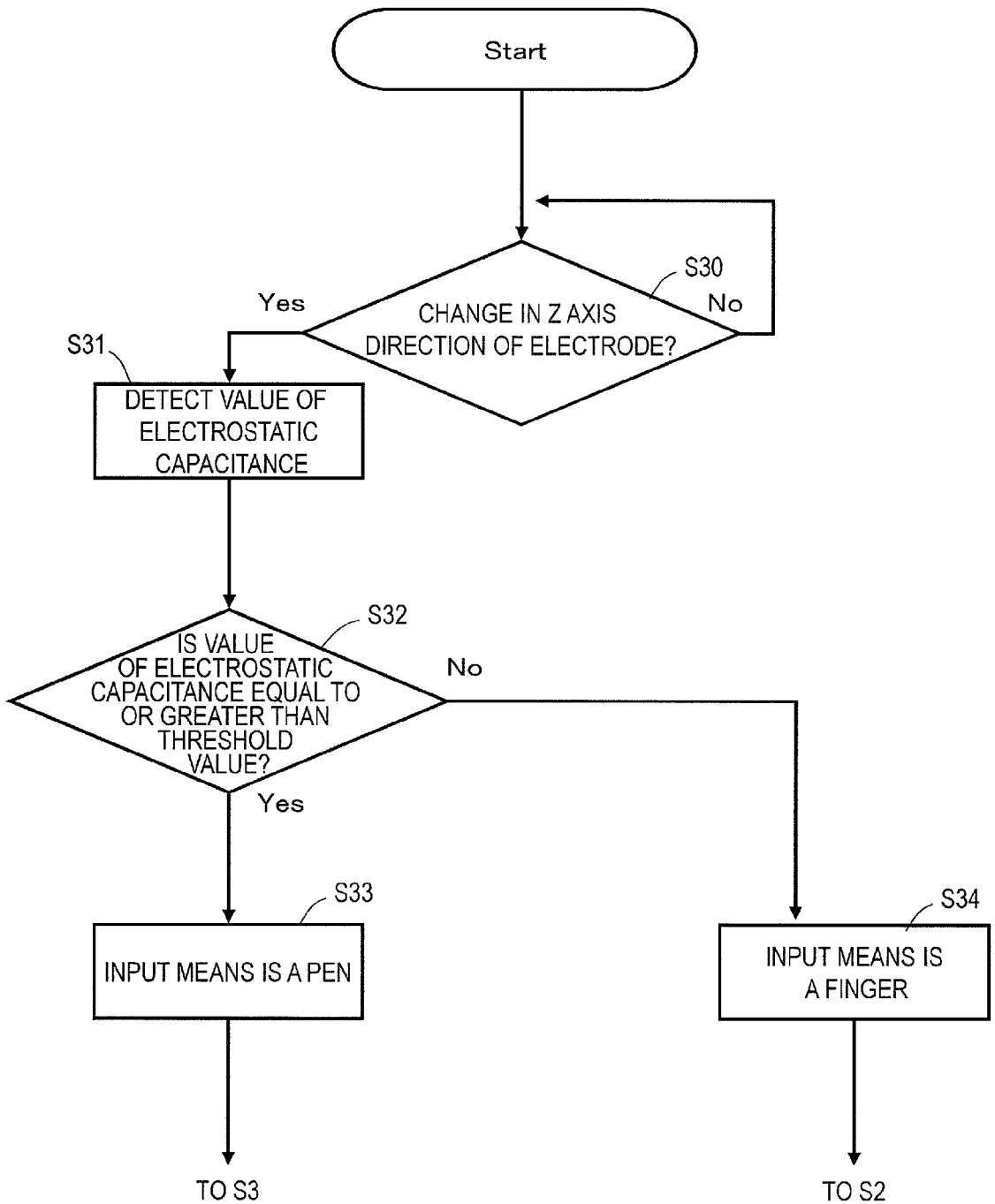
FIG. 12 is a flowchart showing an operation of an electronic device according to an Embodiment.

FIG. 12 is a flowchart showing a flow of touch operation according to the present embodiment.

First, at S30, it is determined whether a change in electrostatic capacitance has occurred in an X electrode and a Y electrode. As the touch panel 11 is pressed, the thickness of the insulating layer 300 for pressure detection changes, thus causing a change in electrostatic capacitance. If an increase in electrostatic capacitance has occurred, it is determined that a touch operation has been made, and control proceeds to S31 to calculate the value electrostatic capacitance, and then control proceeds to S32.

If S32 finds that the value of electrostatic capacitance is equal to or greater than a threshold value, control proceeds to S33 for making the distinction that the input means is a pen, and then control proceeds to S3 in FIG. 9. If S32 finds that the value of electrostatic capacitance is less than the threshold value, control proceeds to S34 for making the distinction that the input means is a finger, and then control proceeds to S2 in FIG. 9.

On the other hand, if S30 finds that no change in electrostatic capacitance has occurred, it is determined that no touch operation has been made, and control returns to S30.

Embodiment 4

Next, an operation of an electronic device according to Embodiment 4 will be described. The electronic device of Embodiment 4 is basically similar in construction to the electronic devices of Embodiments 1 to 3. The electronic device of Embodiment 4 differs from the electronic devices of Embodiments 1 to 3 in that it distinguishes the input means by using an area of contact between the input means and the touch panel. Specifically, the method of distinguishing the input means at S1 in the flowchart of FIG. 9 is different. Hereinafter, the difference will mainly be described.

Figure 13:
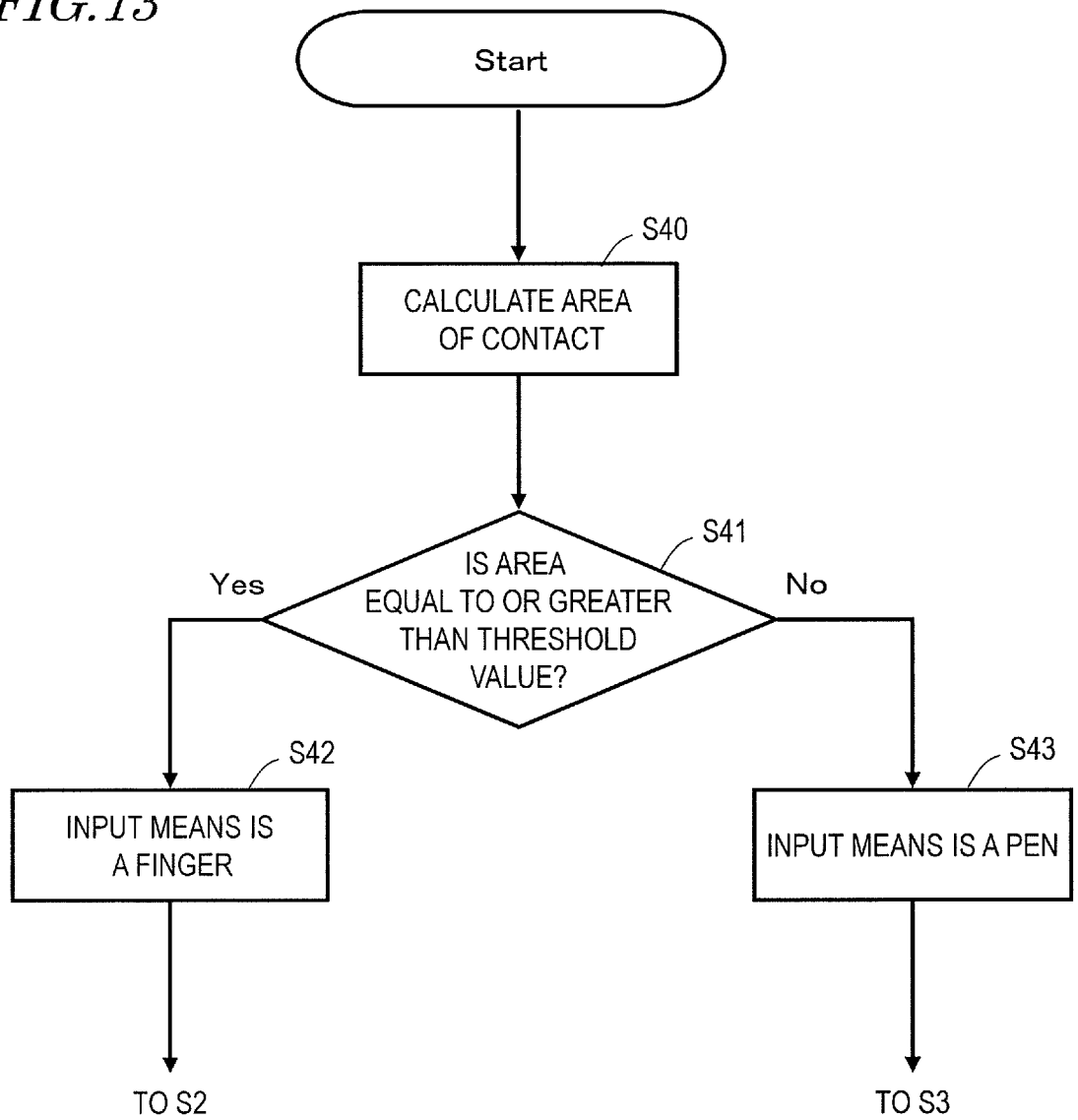
FIG. 13 is a flowchart showing an operation of an electronic device according to an Embodiment.
Figure 14:
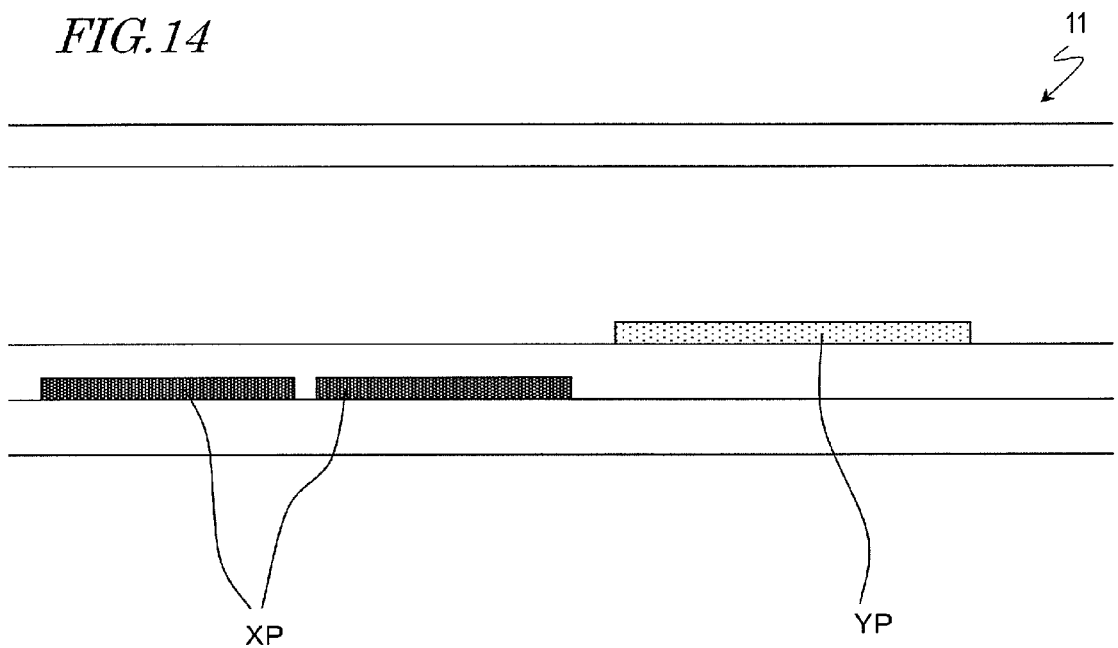
FIG. 14 is a cross-sectional view of a touch panel according to an Embodiment.

FIG. 13 is a flowchart showing a flow of touch operation according to the present embodiment. FIG. 14 is a cross-sectional view showing a touch panel of an electrostatic capacitance type.

In the present embodiment, a distinction as to whether the input means is a finger or a pen is made based on the size of an area of contact between the input means and the touch panel 11.

Specifically, if the area of contact is equal to or greater than a certain threshold value, it is distinguished to be a finger, and if the area of contact is less than the threshold value, it is distinguished to be a pen. For example, the threshold value may be chosen to be an area of contact which is based on the assumption that the tip of a pen has a diameter of 1 mm, although any arbitrary value can be set as the threshold value. An area of contact with a finger is usually larger than an area of contact with a pen; therefore, if this value is equaled or exceeded, a distinction can be made that a finger touch has occurred.

Next, a flow of processes according to the present embodiment will be described with reference to a flowchart show in FIG. 13.

First, an area of contact is detected at S40. Specifically, by detecting a region in which an X electrode and a Y electrode have undergone a change in electrostatic capacitance, an area of contact can be determined. After an area of contact is calculated at S40, the process proceeds to S41. At S41, it is determined whether the area of contact is equal to or greater than the threshold value.

If S41 finds that the area of contact is equal to or greater than the threshold value, control proceeds to S42 for making the distinction that the input means is a finger, and then control proceeds to S2. If S41 finds that the area of contact is less than the threshold value, control proceeds to S43 for making the distinction that the input means is a pen, and then control proceeds to S3.

Embodiment 5

Next, an electronic device according to Embodiment 5 will be described. The electronic device of Embodiment 5 is basically similar in construction to the electronic devices of Embodiments 1 to 4. The electronic device of Embodiment 5 differs from the electronic devices of Embodiments 1 to 4 in that it includes a touch panel of an electromagnetic type. Hereinafter, the difference will mainly be described.

Figure 15:
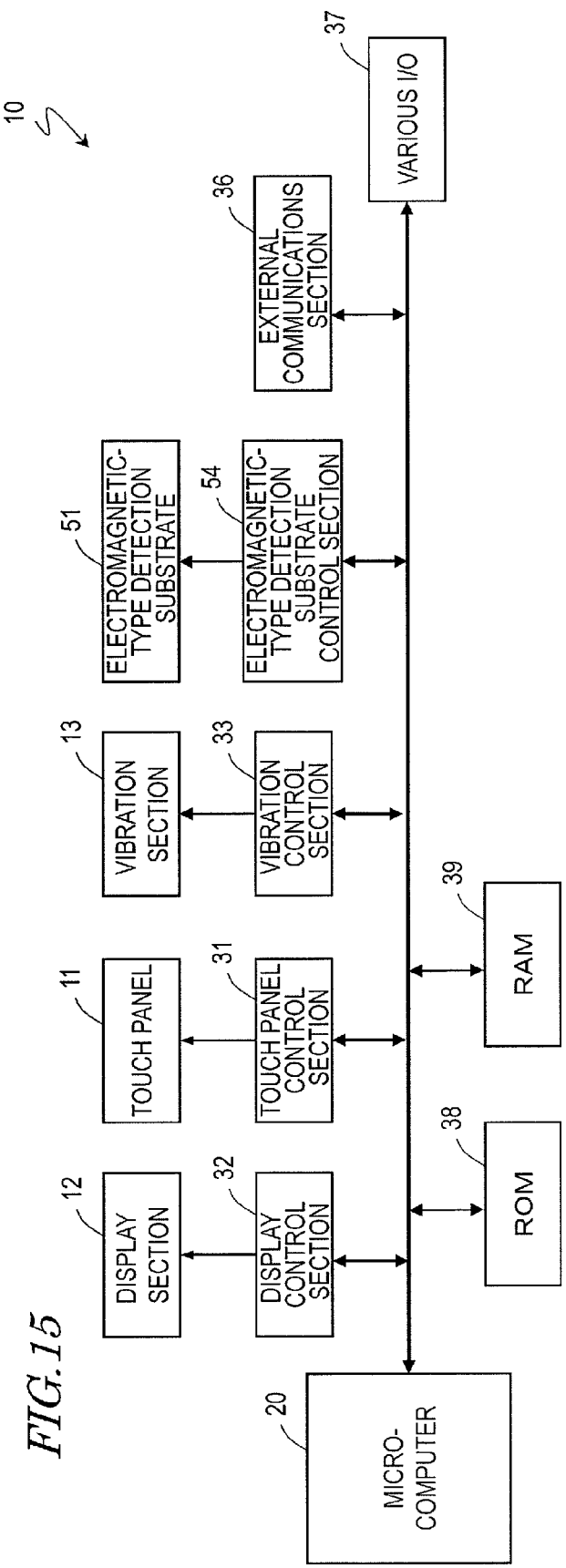
FIG. 15 is a block diagram showing an electronic device according to an Embodiment.

FIG. 15 is a block diagram showing the construction of an electronic device according to the present embodiment. The electronic device 10 of the present embodiment further includes an electromagnetic-type detection substrate 51 and an electromagnetic-type detection substrate control section 54.

Figure 16:
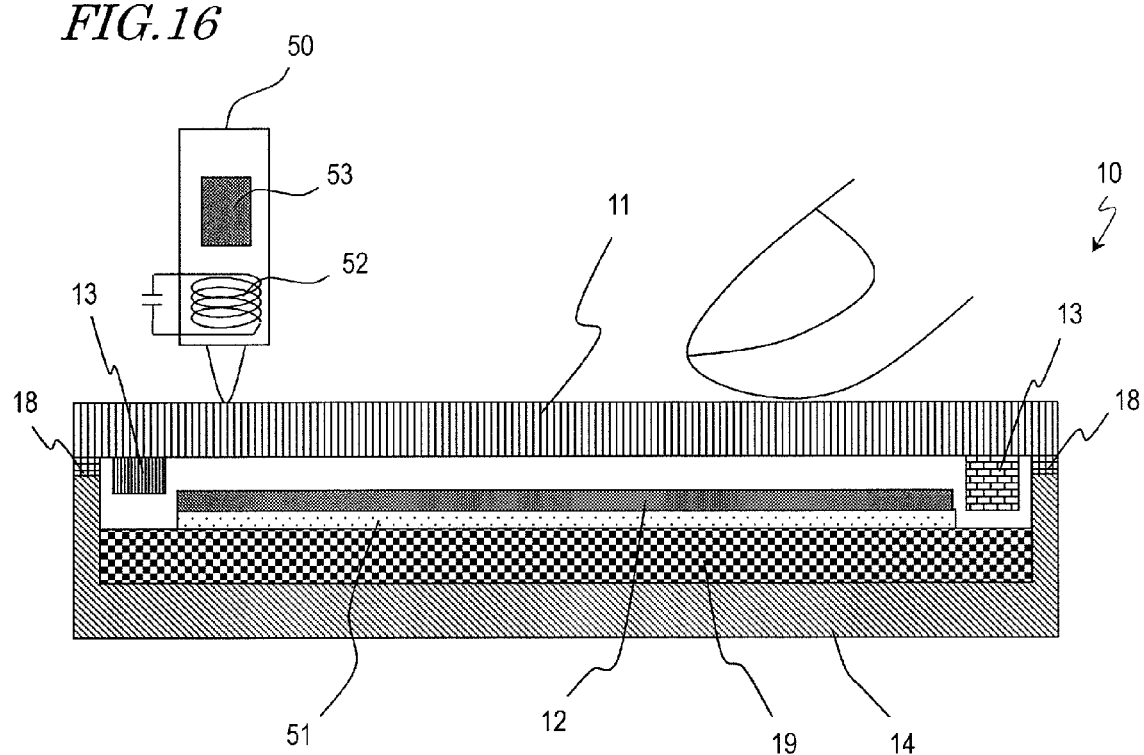
FIG. 16 is a cross-sectional view of an electronic device according to an Embodiment.

FIG. 16 is a cross-sectional view of the electronic device 10. A pen 50 to be used for a touch operation includes internally a coil 52 and a pressure detection section 53. As a touch panel 11, an electrostatic capacitance type touch panel as shown in FIG. 14 is mounted.

<Text Input Operation>

In the case of a touch operation with a finger, similarly to Embodiment 1 described above, a change in electrostatic capacitance of an X electrode and a Y electrode is detected to determine the coordinates where a touch has occurred.

A case where a touch is made with the pen 50 will be described with reference to FIG. 16. The electromagnetic-type detection substrate 51 includes a coil pattern (not shown) within its plane. As the pen 50 approaches the electromagnetic-type detection substrate 51, the coil 52 within the pen 50 is excited by the coil pattern of the electromagnetic-type detection substrate 51 to generate a current. As the voltage of the coil pattern of the electromagnetic-type detection substrate 51 changes due to a counter electromotive force associated with the excited current, the approaching pen 50 can be detected. When the pen 50 touches the touch panel 11, the touch is detected by the pressure detection section 53 within the pen 50. Once the touch is detected by the pressure detection section 53, the pressure detection section 53 applies certain control to the current flowing through the coil 52. This change in the current is read based on a change in voltage in the coil pattern of the electromagnetic-type detection substrate 51, whereby the pen 52 and the touch panel 11 having come into contact is detected.

Thus, when a touch operation is made with a finger, it is detected by the touch panel control section 31 as a change in electrostatic capacitance, and when a touch operation is made with the pen 50, it is detected by the electromagnetic-type detection substrate control section 54 as a change in voltage.

Figure 17:
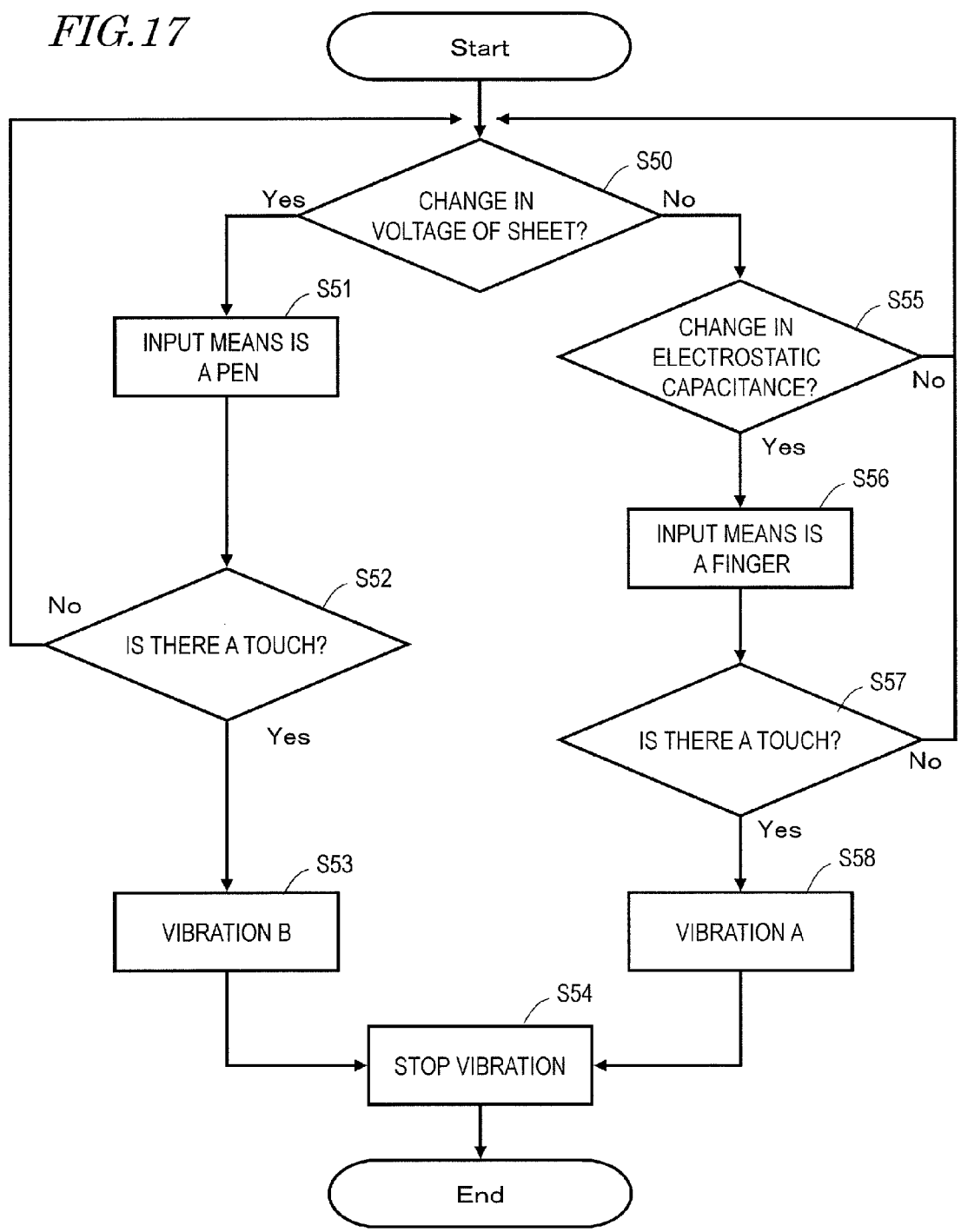
FIG. 17 is a flowchart showing an operation of an electronic device according to an Embodiment.

FIG. 17 is a flowchart showing a flow of touch operation according to the present embodiment. First, at S50, it is detected whether a change in voltage on the electromagnetic-type detection substrate 51 has occurred. If a change in voltage has occurred, control proceeds to S51 for making the determination that the input means is the pen. Thereafter, control proceeds to S52 to determine whether a touch with the pen has been made to the touch panel 11. If S52 finds that a touch has been made, control proceeds to S53. At S53, the vibration control section 33 controls the vibration section 13 to generate vibration B. Thereafter, the process proceeds to S54 to stop the vibration. If S52 finds that no touch has been made, control returns to S50.

On the other hand, if no change in voltage on the electromagnetic-type detection substrate 51 is found at S50, control proceeds to S55 to determine whether a change in electrostatic capacitance has occurred. If it is determined at S55 that a change in electrostatic capacitance has occurred, control proceeds to S56 for making the determination that the input means is a finger. If it is determined at S55 that no change in electrostatic capacitance has occurred, the process returns to S50.

If it is determined at S56 that the input means is a finger, the process proceeds to S57 to determine whether a touch with a finger has been made to the touch panel 11. If S57 finds that a touch has been made, control proceeds to S58. At S58, the vibration control section 33 controls the vibration section 13 to generate vibration A. Thereafter, the process proceeds to S54 to stop the vibration. If S57 finds that no touch has been made, the process returns to S50.

Note that the operation of the electronic devices 10 according to Embodiments 1 to 5 described above may be implemented in hardware or software. A program for realizing such a control operation may be stored in an internal memory of the microcomputer 20 or a ROM 38. Moreover, such a computer program may be installed to the electrical device 10 from a storage medium (an optical disk, a semiconductor memory, etc.) on which it is recorded, or downloaded via telecommunication lines such as the Internet.

Other Embodiments

Although Embodiments 1 to 5 have been illustrated as embodiments of the present disclosure, the embodiments are not limited thereto. Other exemplary embodiments will be described below.

Although the above-described embodiments illustrate that the input means is distinguished by using a touch panel, this is not a limitation. The method of distinguishing the input means may involve camera shooting.

As for the type of the touch panel, a combination of an electrostatic type and a resistive membrane type may be adopted. A finger is detectable by the electrostatic type, whereas a pen is detectable by the resistive membrane type. That is, a touch panel of any other known types may be used so long as the combination enables distinction of the input means.

Although the above-described embodiments employ piezoelectric elements as the vibration means, the embodiments are not limited thereto. The vibration means may be a vibration motor.

Although the above-described embodiments illustrate that a control section for controlling each component element is provided, the embodiments are not limited thereto. The microcomputer 20 may serve as each of the various control sections such as the vibration control section.

In Embodiment 1 above, a tablet-type personal digital assistant is illustrated as an example electronic device, the electronic device according to the embodiment is not limited thereto. For example, any electronic device having a touch panel, e.g., a mobile phone, a PDA, a game machine, a car navigation system, or an ATM is also applicable.

Although the above-described embodiments illustrate the touch panel 11 to be covering the entire display surface of the display section 12, the embodiments are not limited thereto. For example, a touch panel function may be provided only in a central portion of the display surface, while the peripheral portion may not be covered by anything that confers a touch panel function. In other words, the touch panel may at least cover the input operation area 40 of the display section.

Although the touch panel 11 and the display section 12 are illustrated as separate members in the above-described embodiments, the embodiments are not limited thereto. For example, the touch panel 11 may be adhesively bonded to the display section 12. Alternatively, the display section 12 may have a function of detecting touched positions. In other words, it suffices if touched positions can be detected.

Although the above-described embodiments illustrate that the touch panel 11 is vibrated, the embodiments are not limited thereto. For example, in the case where a cover glass is placed outside the touch panel 11, the cover glass may be vibrated. In other words, it suffices if any member that is touched by the user is vibrated.

SUMMARY

Thus, an electronic device 10 according to one embodiment includes: a display section 12 for displaying an operation area 40; a touch panel 11 disposed so as to at least cover the operation area 40; a vibration section 13 for vibrating the touch panel 11; a vibration control section 33 for controlling a vibration pattern of the vibration section 13; and a microcomputer 20 for detecting whether an operation to the touch panel has been made with a finger of a user or a pen. The vibration control section 33 varies the vibration pattern of the vibration section 13 depending on whether the microcomputer 20 has detected a finger or a pen. With this construction, the electronic device 10 is able to present a vibration pattern which is adapted to the input means of the user. As a result, even if the user operates the touch panel with plural types of input means, e.g., a finger and a touch pen, the electronic device 10 can be operated without allowing the user to feel oddness.

Moreover, the vibration section 13 causes a greater vibration in the touch panel 11 when a finger is detected than when a pen is detected. With this construction, a vibration which is felt through a finger and a vibration which is felt through a pen can be controlled to be about the same. As a result, even if the user operates the touch panel with plural types of input means, e.g., a finger and a touch pen, the user is able to perform operation without feeling oddness.

Moreover, the microcomputer 20 may detect a pressure which is applied to the touch panel 11, and based on the detected pressure, detect whether the operation to the touch panel 11 has been made with a finger or a pen. With this construction, based on a difference in pressure to the touch panel between an input with a user's finger and an input with a pen, the electronic device 10 is able to detect the difference in the user's input means. As a result, the electronic device 10 is able to present a vibration pattern which is adapted to the user's input means.

Moreover, the touch panel 11 may be a touch panel of an electrostatic type. The microcomputer 20 may determine that an operation with a pen has been made when the value of a change in electrostatic capacitance caused by the operation to the touch panel 11 is equal to or greater than a threshold value, and determine that an operation with a finger has been made when the value is less than the threshold value. With this construction, by taking advantage of the differing changes in electrostatic capacitance between an input with a user's finger and an input with a pen, the electronic device 10 is able to detect the difference in the user's input means. As a result, the electronic device 10 is able to present a vibration pattern which is adapted to the user's input means.

Moreover, the touch panel 11 may be a touch panel of an electrostatic type. The microcomputer 20 may detect an area of contact of a portion in which contact between a finger or a pen and a touch panel has occurred. Based on the detected area of contact, the microcomputer 20 may detect whether the operation to the touch panel 11 has been made with a finger or a pen. With this construction, by taking advantage of the differing areas of contact with the touch panel between an input with a user's finger and an input with a pen, the electronic device 10 is able to detect the difference in the user's input means. As a result, the electronic device 10 is able to present a vibration pattern which is adapted to the user's input means.

Moreover, the touch panel 11 may include a touch panel of an electrostatic capacitance type and an electromagnetic-type detection substrate 51. The microcomputer 20 may detect a pen based on a change in voltage of the electromagnetic-type detection substrate 51, and detect a finger based on a change in electrostatic capacitance of the touch panel 11 of an electrostatic capacitance type. With this construction, the electronic device 10 is able to detect the difference in the user's input means. As a result, the electronic device 10 is able to present a vibration pattern which is adapted to the user's input means.

Moreover, the operation of vibrating the touch panel 11 may be performed by the electronic device 10 in accordance with a program. Such a program causes the electronic device 10 to execute a step of detecting whether an operation to the touch panel 11 has been made with a finger of a user or a pen, and a step of varying the vibration pattern of the touch panel depending on whether a finger is detected or a pen is detected. With such a program, the electronic device 10 is able to present a vibration pattern which is adapted to the user's input means.

An electronic device according to an embodiment comprising: a display section 12 for displaying an operation area 40; a touch panel 11 disposed on a display surface side of the display section 12; a vibration section 13 for vibrating the touch panel 11; a vibration control section 33 for controlling a vibration pattern of the vibration section 13; and a detection section 20 for detecting whether an operation to the touch panel 11 has been made with a finger of a user or a pen, wherein the vibration control section 33 varies the vibration pattern of the vibration section 13 depending on whether a finger or a pen is detected by the detection section 20.

In one embodiment, the vibration section 13 causes a greater vibration in the touch panel 11 when a finger is detected than when a pen is detected.

In one embodiment, the detection section 20 detects a pressure applied to the touch panel 11, and based on the detected pressure, detects whether the operation to the touch panel 11 is made with a finger or a pen.

In one embodiment, the touch panel 11 is a touch panel 11 of an electrostatic type; and the detection section 20 determines that the operation is made with a pen if the value of a change in electrostatic capacitance caused by the operation to the touch panel 11 is equal to or greater than a threshold value, and determines that the operation is made with a finger if the value of the change in electrostatic capacitance is less than the threshold value.

In one embodiment, the touch panel 11 is a touch panel 11 of an electrostatic type; and the detection section 20 detects an area of contact of a portion in which contact between a finger or pen and the touch panel 11 has occurred, and based on the detected area of contact, detects whether the operation to the touch panel 11 is made with a finger or a pen.

In one embodiment, the detection section 20 determines that the operation is made with a finger if the detected area of contact is equal to or greater than a threshold value, and determines that the operation is made with a pen if the detected area of contact is less than the threshold value.

In one embodiment, the touch panel 11 includes a touch panel 11 of an electrostatic capacitance type and an electromagnetic-type detection substrate; and the detection section 20 detects a pen based on a change in voltage of the electromagnetic-type detection substrate, and detects a finger based on a change in electrostatic capacitance of the touch panel 11 of an electrostatic capacitance type.

A program according to an embodiment is a program for causing an electronic device to perform an operation of vibrating a touch panel 11, the program causing the electronic device to execute: a step of detecting whether an operation to the touch panel 11 has been made with a finger of a user or a pen; and a step of varying a vibration pattern of the touch panel 11 depending on whether a finger or a pen is detected.

Embodiments have been described above as an illustration of the technique of the present disclosure. The accompanying drawings and the detailed description are provided for this purpose. Thus, elements appearing in the accompanying drawings and the detailed description include not only those that are essential to solving the technical problems set forth herein, but also those that are not essential to solving the technical problems but are merely used to illustrate the technique disclosed herein. Therefore, those non-essential elements should not immediately be taken as being essential for the reason that they appear in the accompanying drawings and/or in the detailed description.

The embodiments above are for illustrating the technique disclosed herein, and various changes, replacements, additions, omissions, etc., can be made without departing from the scope defined by the claims and equivalents thereto.

What is claimed is:

1. An electronic device comprising:
   a panel touched by a user;
   a vibration section configured to vibrate the panel;
   a vibration control section configured to control a vibration of the vibration section; and
   a detection section configured to detect between whether an operation to the panel has been made with a finger of a user or whether the operation to the panel has been made with an input means other than a finger, wherein
   the vibration control section varies the vibration of the vibration section differently depending on whether the finger of the user or the input means other than the finger is detected by the detection section, and
   the vibration section causes a greater vibration in the panel when the finger is detected than when the input means other than the finger is detected in order to compensate for differences in vibration propagation characteristics between the finger of the user and the input means other than the finger, so that the user feels approximately the same degree of a vibration regardless of whether the operation to the panel has been made with the finger of the user or the input means other than the finger.

2. The electronic device of claim 1, wherein the detection section detects a pressure applied to the panel, and based on the detected pressure, detects whether the operation to the panel is made with the finger or the input means other than the finger.

3. The electronic device of claim 1, wherein,
   the panel is a panel of an electrostatic type; and
   the detection section determines that the operation is made with the input means other than the finger if the value of a change in electrostatic capacitance caused by the operation to the panel is equal to or greater than a threshold value, and determines that the operation is made with the finger if the value of the change in electrostatic capacitance is less than the threshold value.

4. The electronic device of claim 1, wherein,
   the panel is a panel of an electrostatic type; and
   the detection section detects an area of contact of a portion in which contact between the finger or the input means other than the finger and the panel has occurred, and based on the detected area of contact, detects whether the operation to the panel is made with the finger or the input means other than the finger.

5. The electronic device of claim 4, wherein the detection section determines that the operation is made with the finger if the detected area of contact is equal to or greater than a threshold value, and determines that the operation is made with the input means other than the finger if the detected area of contact is less than the threshold value.

6. The electronic device of claim 1, wherein,
   the panel includes a panel of an electrostatic capacitance type and an electromagnetic-type detection substrate; and
   the detection section detects the input means other than the finger based on a change in voltage of the electromagnetic-type detection substrate, and detects the finger based on a change in electrostatic capacitance of the panel of an electrostatic capacitance type.

* * * * *